United States Patent
Lee et al.

(10) Patent No.: US 6,442,079 B2
(45) Date of Patent: Aug. 27, 2002

(54) VOLTAGE REGULATOR CIRCUIT FOR A SEMICONDUCTOR MEMORY DEVICE

(75) Inventors: Byeong-Hoon Lee; Seung-Keun Lee, both of Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/765,692

(22) Filed: Jan. 19, 2001

(30) Foreign Application Priority Data

Feb. 3, 2000 (KR) .......................................... 2000-5360

(51) Int. Cl.$^7$ ............................................... G11C 7/00
(52) U.S. Cl. .................................. 365/189.09; 365/226
(58) Field of Search ............................. 365/189.09, 226

(56) References Cited

U.S. PATENT DOCUMENTS 6,147,914 A  * 11/2000 Leung et al. .......... 365/189.09

* cited by examiner

Primary Examiner—M. Tran
(74) Attorney, Agent, or Firm—Marger Johnson & McCollom, P.C.

(57) ABSTRACT

A word line voltage generating circuit has a high voltage generator for generating a high voltage is response to an activation signal. In addition it has a regulator circuit that includes two successive regulators. The first regulator receives the high voltage and outputs an intermediate voltage in response to a reference voltage and the activation signal. The first regulator receives the reference voltage, and adjusts the high voltage to deliver a word line voltage. The second stage includes has a depletion-type NMOS transistor, which can clamp the high voltage to a voltage of a required level.

22 Claims, 6 Drawing Sheets

VOLTAGE REGULATOR CIRCUIT FOR A SEMICONDUCTOR MEMORY DEVICE

This application relies from priority upon Korean Patent Application No. 2000-05360, filed on Feb. 3, 2000, the contents of which are herein incorporated by reference in their entirety.

FIELD OF THE INVENTION

The present invention relates to a nonvolatile storage device and, more particularly, to a voltage regulator for nonvolatile storage devices of the electrically erasable and programmable semiconductor type.

BACKGROUND OF THE INVENTION

Nonvolatile data storage devices, such as flash memory devices, include an array of memory cells for storing the data. Each memory cell is formed of a MOS transistor whose gate electrode, located over its channel region, is a so-called floating gate. This electrode has a high direct current (DC) impedance toward all the other terminals of the same cell, and also towards the circuit in which the cell is connected. The cell further includes a second electrode, called the control gate electrode, which is driven by means of appropriate control voltages for storing ("writing") data and retrieving ("reading") data. The other electrodes of the transistor are known as its drain, source and bulk (or body) terminals.

The amount of electrical charge present on the floating gate can be changed by applying appropriate voltage values to the cell terminals. The change is using phenomena known as Fowler-Nordheim's Tunneling and/or Channel Hot Electron Injection. Different amounts of charges result in the transistor being placed in either one of two logic states. The first state (referred to as "an OFF state") is of "high" threshold voltage (existing in a threshold voltage range of 6V to 7V), and the second state (referred to as "an ON state) is of "low" threshold voltage (existing in a threshold voltage range of 1V to 3V).

Since the floating gate has high impedance toward any other terminals of the cell, the stored charge can persist therein for an indefinite length of time, even after the power supply voltage to the circuit, which contains it, has been cut off. The cell has, therefore, characteristics of a nonvolatile memory.

A read operation determines whether the memory cell has the OFF or the ON states. During the read operation of a cell, a specified voltage (e.g., 4.5V) is applied to its control gate and a ground voltage is applied to its source. If the memory cell has the OFF state, no current flows from its drain to its source. This makes a voltage of a bit line increased, so that the memory cell is judged to have the OFF state by a well-known sense amplifier (not shown). If the memory cell has the ON state, current flows from its drain to its source. This makes the voltage of the bit line lowered, and thereby the memory cell is judged to have the ON state by the sense amplifier.

It will be appreciated by the above description that the memory device should have the capability of applying diverse voltages to the cell.

Referring to FIG. 1, there is illustrated a block diagram which shows a NOR-type flash memory device in the prior art that uses a conventional voltage regulator. The memory device of FIG. 1 comprises an array 10 of memory cells arranged as a matrix. The matrix is points at the intersections of rectangularly arranged rows (called the word lines WL0 to WLi), and columns (called bit lines BL0 to BLj).

A voltage VPPi from a word line voltage generating circuit 30 is supplied to a word line WLi through a decoder 20 as a word line voltage (or a read voltage). The word line voltage generating circuit 30 consists of a high voltage generator 32 and a voltage regulator 34.

The high voltage generator 32 generates a high voltage VPP. High voltage VPP is higher than a power supply voltage VCC, when a boost enable signal EN is activated as a control signal. (The high voltage generator 32 also includes a booster circuit well known in the art.) The voltage regulator 34 adjusts the high voltage VPP, so as to produce a word line voltage VPPi of the required level. High voltage VPP is maintained at the power supply voltage level VCC when the boost enable signal EN is inactivated.

Referring now to FIG. 2, a circuit diagram of voltage regulator 34 in the prior art is shown. Voltage regulator 34 consists of a comparator 35, a PMOS transistor MP1 used as a driver, and two resistors R1 and R2 used as a divider, which are connected as illustrated in the figure. The comparator 35 judges whether an output voltage Vdiv of the divider (R1 and R2) is lower than a reference voltage Vref, and the PMOS transistor MP1 operates according to a judgment result of the comparator 35. For example, if, as a judgment result of the voltage regulator 34, the voltage VPPi is lower than a required voltage level (Vref>Vdiv), the PMOS transistor MP1 supplies current from the voltage VPP to an output terminal VPPi, so that the output voltage VPPi is increased up to the required voltage level. On the other hand, if the voltage VPPi is higher than the required level (Vref<Vdiv), the current supply through the PMOS transistor MP1 is blocked, so that the voltage VPPi is lowered down to the required voltage level.

Referring now also to FIG. 3, an operation is described. The output voltage VPP of the high voltage generator 32 is maintained at the power supply voltage level when the boost enable signal EN is at an inactivation state. On the other hand, when the boost enable signal EN is at an activation state (at time t1), the high voltage generator 32 generates the high voltage VPP, which is boosted from the power supply voltage level VCC in short time (e.g., several nanoseconds). The voltage regulator 34 adjusts the high voltage VPP thus generated so as to have the output VPPi of the required voltage level, that is, a word line voltage $V_{WL}$.

Voltage regulator 34 has a problem, however. Since the voltage VPPi adjusted by the voltage regulator 34 is always sensed, a DC current path is formed between the high voltage VPP and the ground voltage. This causes the capacity of the high voltage to be reduced, since current leaks through the divider. This is partly ameliorated by designing the resistors R1 and R2 to have relatively large values, the DC current between the high voltage VPP and the ground voltage is reduced. This, however, slows down a response speed of the voltage regulator 34. The main cause of the drop of the response speed is RC-type delay, owing both to a capacitance value of the PMOS transistor MP1 having large driving capacity, and a resistance value of the divider R1, R2.

As also illustrated in FIG. 3, to account for the RC type delay, the voltage VPPi adjusted by the voltage regulator 34 is not clamped exactly at a required voltage level $V_{WL}$. Instead, the voltage VPPi is designed to overshoot, by increasing over the required voltage level. Overshooting is between points of time t2 and t3, as illustrated by dashed circle A in FIG. 3. (The overshot voltage level is determined by the RC delay time).

Unavoidably, the overshot voltage VPPi is applied to a selected word line WLi through the decoder 20 as a word line voltage $V_{WL}$. As a result, since the word line voltage $V_{WL}$ is higher than a required voltage level, read fail occurs, especially toward a memory cell of an OFF state. This is because the word line voltage $V_{WL}$ exists in a threshold voltage distribution of the OFF state, or because sensing margin for the memory cell of the OFF state is reduced. Therefore, it is preferred to exactly clamp the voltage VPPi at a required voltage level without the overshooting of the voltage VPPi (in FIG. 3, a portion marked by a dotted line A).

SUMMARY OF THE INVENTION

The invention overcomes this problem in the prior art.

The invention provides a semiconductor flash memory device that has a voltage generating circuit for supplying through an output terminal a word line voltage clamped exactly at voltage levels as required. Clamping prevents the overshooting problem.

More specifically, the voltage generating circuit includes a high voltage generator for generating a high voltage that is higher than the power supply voltage. The voltage generating circuit also includes a voltage regulator circuit having two voltage regulators, both receiving the high voltage. The first regulator outputs an intermediate voltage that is constantly lower than the high voltage. The second regulator receives the intermediate voltage, and outputs the final word line voltage.

The second regulator is connected to the first regulator without the feedback arrangement of the prior art. Lacking in a feedback arrangement, the circuit of the invention does not waste leakage current.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings, wherein.

DESCRIPTION OF THE PREFERRED EMBODIMENT

The preferred embodiment of the invention will be more fully described with reference to the attached drawings.

Figure 4:
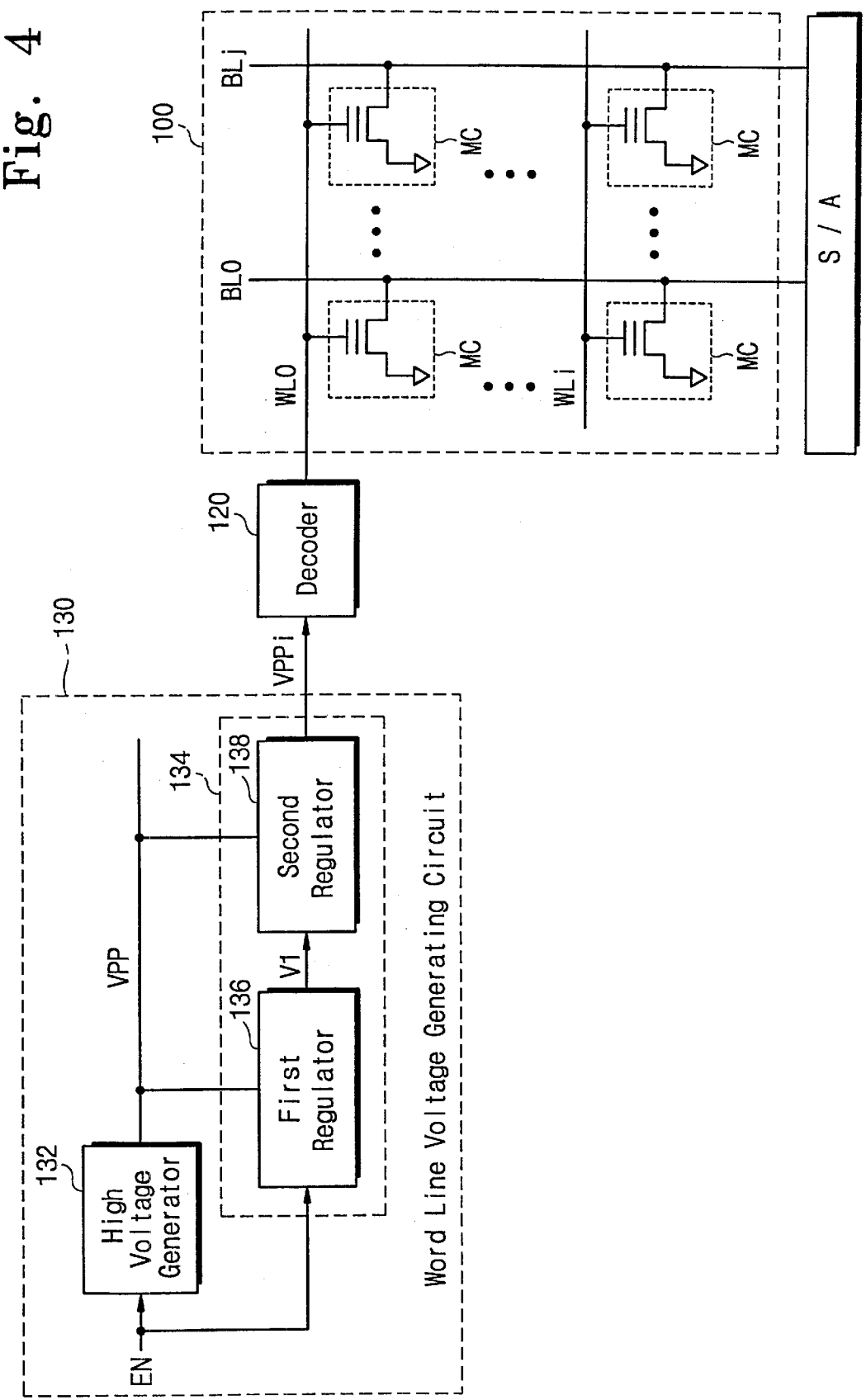
FIG. 4 is a block diagram showing a flash memory device with a voltage regulator circuit made according to an embodiment of the present invention.

Referring now to FIG. 4, a block diagram illustrates a flash memory device having a voltage regulator circuit according to an embodiment of the present invention. The memory device in FIG. 4 comprises an array 100 of memory cells arranged in a matrix at intersections of rows (word lines WL0 to WLi) and columns (bit lines BL0 to BLj). A voltage VPPi from a word line voltage generating circuit 130 is supplied to a selected word line WLi through a decoder 120 as a word line voltage.

The word line voltage generating circuit 130 consists of a high voltage generator 132 and a voltage regulator circuit 134. The high voltage generator 132 may consist of a well-known booster circuit. The high voltage generator 132 generates a high voltage VPP that is higher than a power supply voltage in response to a boost enable signal EN.

The voltage regulator circuit 134 receives the high voltage VPP, and outputs a predetermined word line voltage VPPi. Herein, the high voltage VPP is maintained at the power supply voltage VCC when the boost enable signal EN is at an inactivation state.

The voltage regulator circuit 134 has two regulators 136, 138 in a two-stage regulator structure. The first regulator 136 receives the high voltage VPP from the high voltage generator 132, and outputs an intermediate voltage V1. V1 is lower than the high voltage VPP, lower than a word line voltage $V_{WL}$, and preferably has a constant voltage. The second regulator 138 receives the intermediate voltage V1 from the first regulator 136, and uses it to clamp the high voltage VPP. The second regulator 138 thus outputs the word line voltage VPPi.

A result of this arrangement is that the output voltage VPPi can be made identical to a desired predetermined word line voltage $V_{WL}$.

Figure 5:
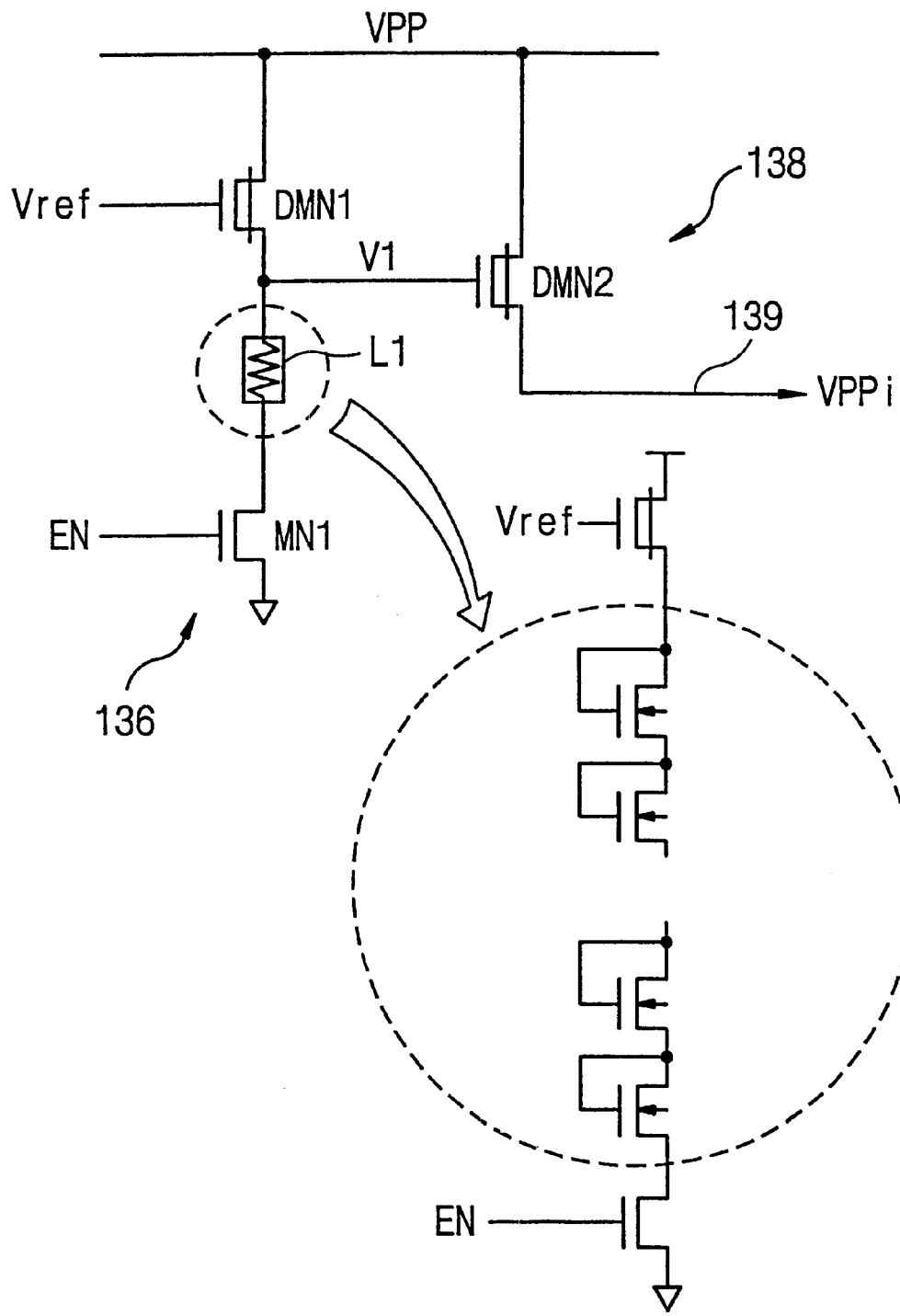
FIG. 5 is an electrical diagram of a preferred embodiment of the voltage regulator of FIG. 4.

Referring now to FIG. 5, a preferred embodiment of the voltage regulator circuit 134 is described. The voltage regulator circuit 134 includes a first regulator 136 and a second regulator 138.

In one embodiment, first regulator 136 consists of a depletion-type NMOS transistor DMN1, a load L1 and an NMOS transistor MN1. The gate of transistor DMN1 is connected to a reference voltage Vref. The depletion-type NMOS transistor DMN1, has its drain (or, referred to as a first current electrode) connected to the high voltage VPP generated by the high voltage generator 132. The source (or, referred to as a second current electrode) of the transistor DMN1 is grounded through the load L1 and the NMOS transistor MN1.

The NMOS transistor MN1 of the first regulator 136 is turned on/off according to a boost enable signal EN. That is, the NMOS transistor MN1 is turned on when the high voltage generator 132 operates, and is turned off when the high voltage generator 132 does not operate. Therefore, while the high voltage generator 132 does not operate, the NMOS transistor MN1 blocks DC current path between the high voltage VPP and the ground voltage.

In addition, second regulator 138 consists of a depletion-type NMOS transistor DMN2. The gate electrode (or, referred to as a control gate electrode) of the depletion-type NMOS transistor DMN2 is connected to the source of the depletion-type NMOS transistor DMN1 (or, one terminal of the load opposite to the ground voltage). The drain of the transistor DMN2 is connected to the high voltage VPP, and the source thereof is connected to an output terminal 139 for the voltage VPPi.

As illustrated in FIG. 5, the load L1 of the first regulator 136 can consist of a plurality of serially connected NMOS transistors. However, it is obvious to ones skilled in the art that the load L1 can be realized using other integrated circuit elements operating as a resistor.

As well known in the art, each of the depletion-type NMOS transistors DMN1 and DMN2 has a negative threshold voltage (−Vthd), and operates at a saturation region when a drain-to-source voltage Vds is identical to or more than a voltage (Vg−(−Vthd)). That is, the depletion-type NMOS transistors DMN1 and DMN2 are blocked (or go to a shutoff state) at such a condition as Vds≧(Vg−(−Vthd)). According to this transistor characteristics, the voltage VPPi adjusted by the voltage regulator circuit 130 is exactly clamped (or adjusted) at the voltage (Vds≧Vg−(−Vthd)), which will be described more fully below.

Figure 6:
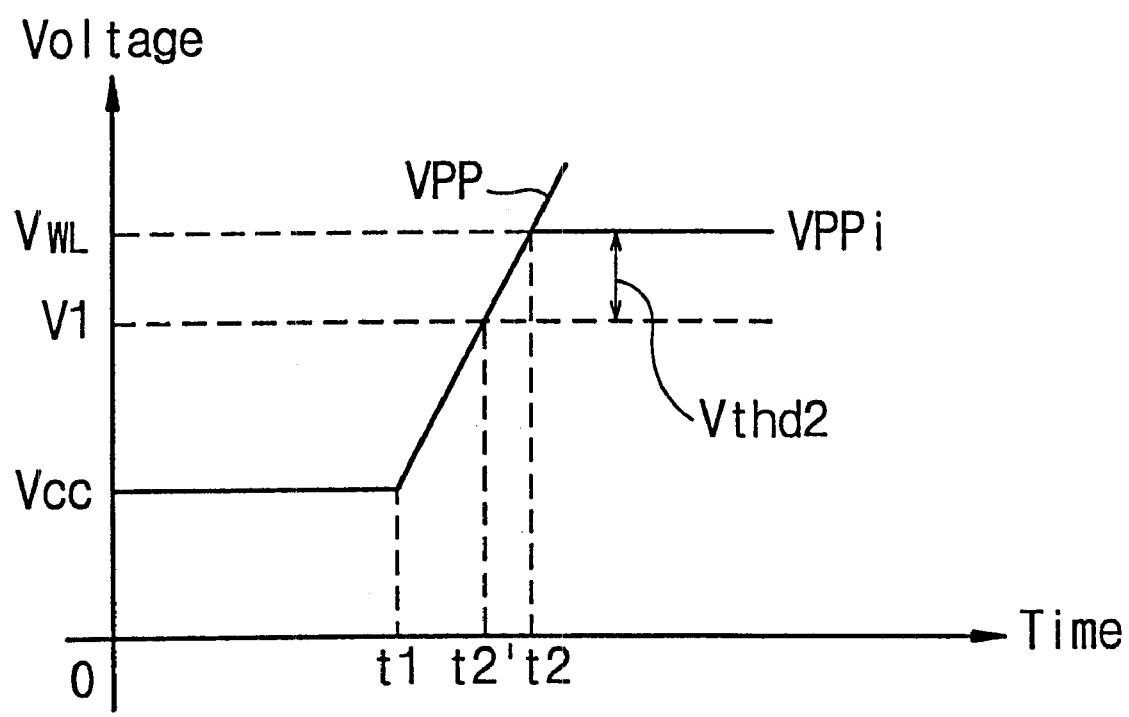
FIG. 6 is a diagram showing a time evolution of an output voltage of the voltage regulator of FIG. 5.

As illustrated in FIG. 6, when the high voltage generator 132 does not operate (the boost enable signal EN is maintained at a logic low level as an inactivation state), that is, during a period of time t0–t1, an output voltage VPP of the high voltage generator 132 is maintained at the power supply voltage Vcc. When the boost enable signal EN goes high as an activation state (t1), the output voltage VPP of the high voltage generator 132 is increased gradually and rapidly from the power supply voltage Vcc in short time (e.g., several nanoseconds). As the high voltage VPP is increased, the gate voltage of the depletion-type NMOS transistor DMN2 (or the source voltage of the transistor DMN1) is also increased.

After this, the drain-to-source voltage Vds of the depletion-type NMOS transistor DMN1 reaches a voltage Vref−(−Vthd1) (herein, −Vthd1 is a threshold voltage of the depletion-type NMOS transistor DMN1), the depletion-type NMOS transistor DMN1 is shut off. Therefore, the gate voltage V1 of the depletion-type NMOS transistor DMN2 becomes a voltage Vref+Vthd1. That is, the depletion-type NMOS transistor DMN1 adjusts (or clamps) the high voltage VPP so as to have the voltage Vref+Vthd1 at a point of time t2'. Herein, the voltage Vref+Vthd1 is designed to be higher than the power supply voltage Vcc and is lower than a predetermined word line voltage $V_{WL}$.

The load L1 and the NMOS transistor MN1 of the first regulator 136 are used to prevent the source of the depletion-type NMOS transistor DMN1 from being floated. If the load L1 and the NMOS transistor MN1 were not provided, the gate voltage V1 of the depletion-type NMOS transistor DMN2 would be boosted when the source voltage of the depletion-type NMOS transistor DMN1 goes to a voltage Vref+Vthd1 (or, the transistor DMN1 is shut off). This would set the voltage VPPi higher than the required voltage level.]

And then, when the output voltage VPP of the high voltage generator 132 reaches a word line voltage $V_{WL}$ at a point of time t2, the depletion-type NMOS transistor DMN2 is also shut off. Thus, the voltage VPPi is clamped exactly at the word line voltage $V_{WL}$ of the required level. More particularly, as the high voltage VPP is increased over the constant voltage V1, the source voltage of the depletion-type NMOS transistor DMN2 is also increased. At this time (t2'), the depletion-type NMOS transistor DMN1 becomes shut off, and thus the source voltage V1 thereof becomes fixed at a voltage Vref+Vthd1. After this, the drain-to-source voltage Vds of the depletion-type NMOS transistor DMN1 reaches a voltage V1−(−Vthd2) (herein, −Vthd2 is a threshold voltage of the transistor DMN2) at a point of time t2, the depletion-type NMOS transistor DMN2 becomes shut off. Therefore, the voltage VPPi, which is adjusted by the voltage regulator 134, is clamped to a voltage V1+Vthd2 by the depletion-type NMOS transistor DMN2. It is obvious to ones skilled in the art that adjusting the reference voltage Vref and the threshold voltages −Vthd1 and −Vthd2 varies the voltage VPPi.

Figure 1:
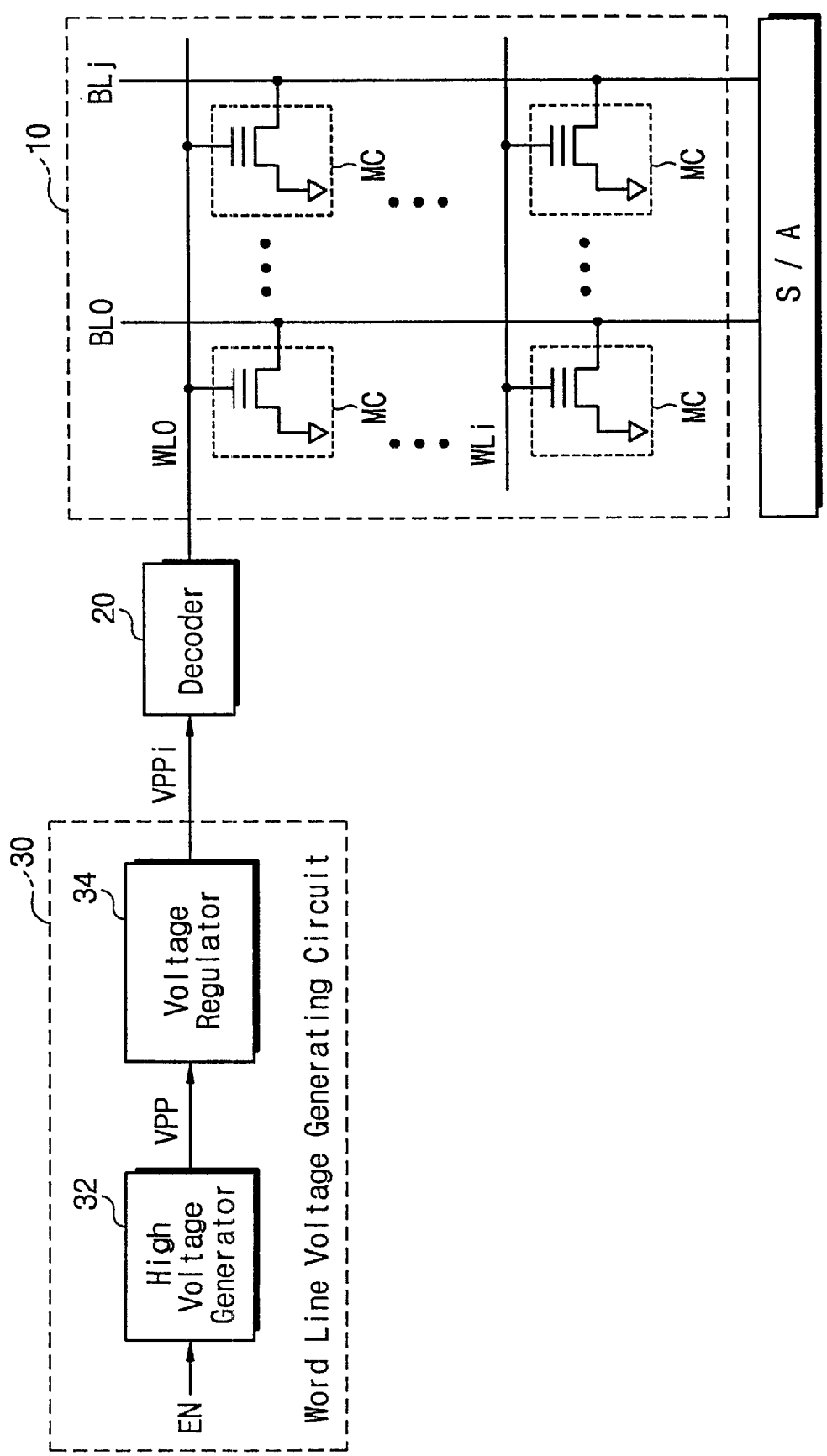
FIG. 1 is a block diagram of a flash memory device having a voltage regulator in the prior art.
Figure 2:
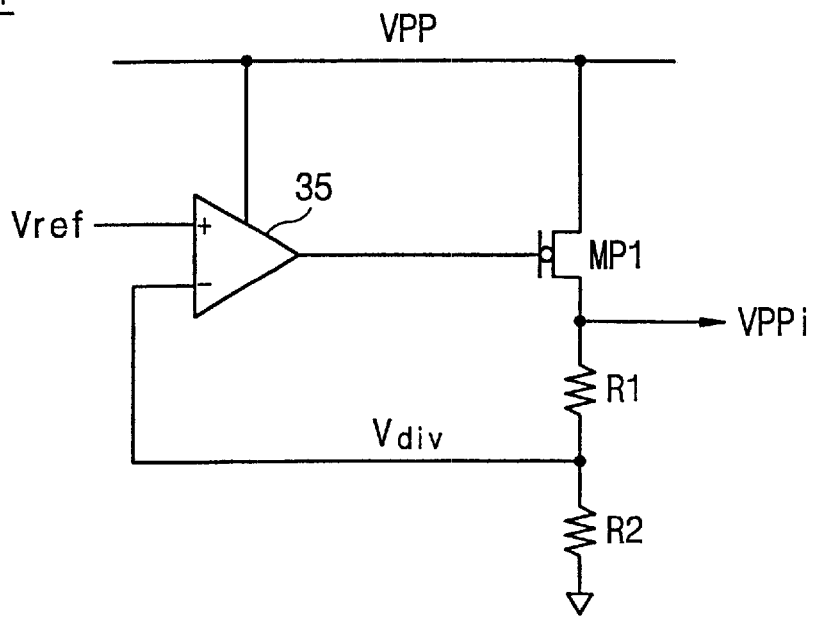
FIG. 2 is an electrical diagram of a most frequently used voltage regulator of the voltage regulator in FIG. 1.
Figure 3:
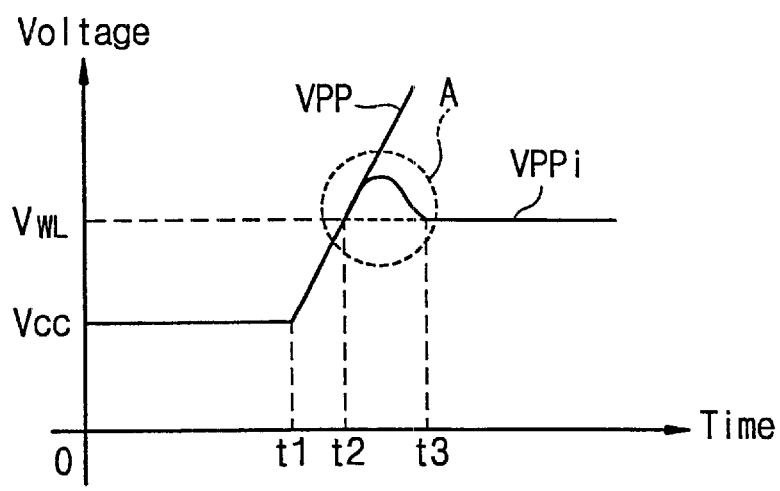
FIG. 3 is a diagram showing a time evolution of an output voltage of the voltage regulator of FIG. 2.

According to the voltage regulator circuit 134 of the present invention having a two-stage regulator structure, the depletion-type NMOS transistor DMN2 is shut off when the high voltage VPP reaches a word line voltage $V_{WL}$ of a required voltage level. The voltage VPPi adjusted by the voltage regulator circuit 134 is exactly clamped without overshooting over a required level in a point of time t2'. Therefore, there are prevented problems (read fail and sense margin reduction owing to an increase of the word line voltage) owing to an overshoot of the voltage VPPi. Furthermore, there is blocked DC current path between the high voltage VPP and the ground voltage that occurs the conventional voltage regulator circuit illustrated in FIG. 2.

Figure 7A:
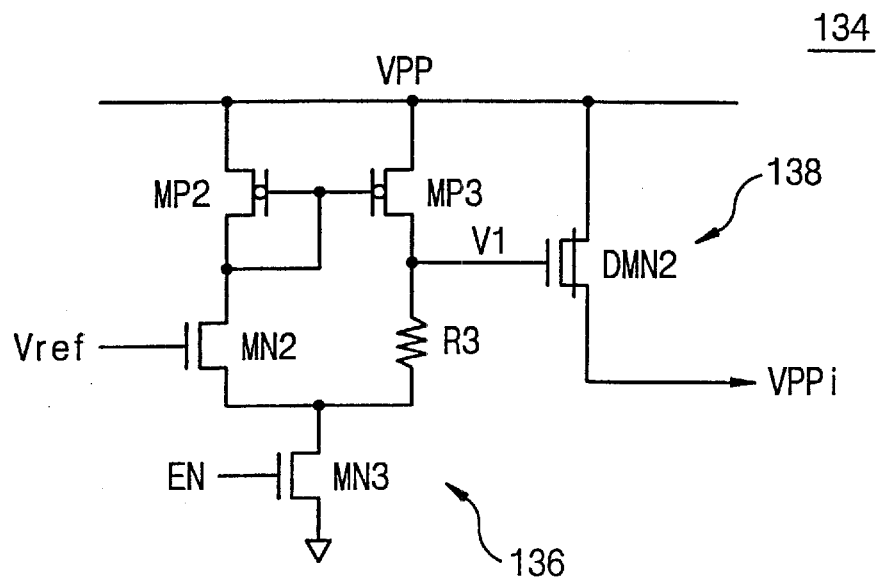
FIGS. 7A and 7B are electrical diagrams of other embodiments of the voltage regulator of FIG. 4.
Figure 7B:
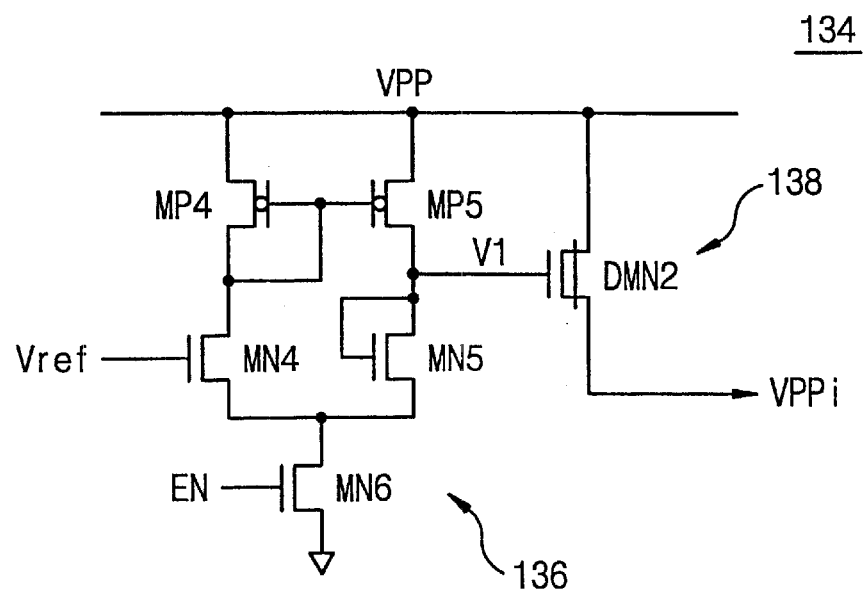

Other embodiments of the first regulator illustrated in FIG. 4 are shown in FIGS. 7A and 7B, where it will be recognized that a current mirror is used.

Referring specifically to FIG. 7A, the first regulator 136 consists of two PMOS transistors MP2 and MP3, two NMOS transistors MN2 and MN3 and a resistor R3. The first regulator 136 clamps the high voltage VPP at the constant voltage V1 when the boost enable signal EN is at a logic high level. The voltage V1 is higher than the power supply voltage VCC, and is lower than a word line voltage $V_{WL}$ of a required level. Similarly with FIG. 5, since the second regulator 138 consists of a depletion-type NMOS transistor DMN2, the voltage VPPi is clamped exactly at a voltage V1+Vthd2 without overshooting. An operation associated with the second regulator is identical to that in FIG. 5, and description thereof is thus omitted as unnecessary.

Referring specifically to FIG. 7B, the first regulator in FIG. 7B is identical to that in FIG. 7A, except that the resistor R3 is replaced with a diode-connected NMOS transistor MN5, and description thereof is thus omitted.

The invention has been described using exemplary preferred embodiments. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A word line voltage generating circuit for delivering a regulated output voltage VPPi, comprising:

a high voltage generator for generating a high voltage VPP that is higher than a power supply voltage;

a first regulator for receiving the high voltage VPP to produce an intermediate voltage V1; and a driver having a threshold voltage Vth to deliver, in response to the intermediate voltage V1, the regulated output voltage VPPi by clamping the high voltage VPP at a voltage given by a sum of the intermediate voltage V1 and the threshold voltage Vth.

2. The circuit of claim 1, in which the high voltage generator generates the high voltage in response to an activation signal, and the first regulator outputs the intermediate voltage in response to the activation signal and to a reference voltage.

3. The circuit of claim 1, in which the driver comprises a depletion-type MOS transistor having a first current electrode coupled to receive the high voltage VPP, a control electrode coupled to receive the intermediate voltage V1, and a second current electrode coupled to deliver the regulated output voltage VPPi, and in which the depletion-type MOS transistor is shut off when the regulated output voltage reaches the voltage (V1+Vth).

4. The circuit of claim 3, in which the first regulator includes:

a second depletion-type MOS transistor having a first current electrode coupled to receive the high voltage, a second current electrode coupled to the control electrode of the first depletion-type MOS transistor, and a control electrode coupled to receive a reference voltage, and a switch coupled between the second current electrode of the second depletion-type MOS transistor and a ground voltage, the switch being switched according to a boost enable signal.

5. The circuit of claim 4, in which the first regulator further includes a load coupled between the second depletion-type MOS transistor and the switch.

6. The circuit of claim 1, in which the first regulator includes:

a first PMOS transistor having a first current electrode coupled to receive the high voltage, a second current electrode coupled to a ground voltage via a first NMOS transistor which is switched according to a reference voltage, and a control electrode coupled to the second current electrode of the first PMOS transistor;

a second PMOS transistor having a first current electrode coupled to receive the high voltage, a second current electrode coupled to the control electrode of the depletion-type MOS transistor, and a control electrode coupled to the control electrode of the first PMOS transistor; and a resistor coupled between the second current electrode of the second PMOS transistor and the ground voltage, wherein the intermediate voltage V1 is received out from the second current electrode of the second PMOS transistor.

7. The circuit of claim 1, in which the first regulator includes:

a first PMOS transistor having a first current electrode coupled to receive the high voltage, a second current electrode coupled to a ground voltage via a first NMOS transistor which is switched according to a reference voltage, and a control electrode coupled to the second current electrode of the first PMOS transistor, a second PMOS transistor having a first current electrode coupled to receive the high voltage, a second current electrode coupled to the control electrode of the depletion-type MOS transistor, and a control electrode coupled to the control electrode of the first PMOS transistor, and a second NMOS transistor having a first current electrode and a control electrode coupled to the control electrode of the depletion-type MOS transistor, and a second current electrode coupled to the ground voltage, wherein the intermediate voltage V1 is received out from the second current electrode of the second PMOS transistor.

8. A semiconductor memory device comprising:

an array of memory cells arranged in rows and columns;

a row decoder for selecting one of the rows; and a word line voltage generating circuit for generating a word line voltage to be supplied to the selected row, the word line voltage generating circuit including:

a high voltage generator for generating a high voltage higher than a power supply voltage, a first regulator for receiving the high voltage to output an intermediate voltage in response to a reference voltage, and a three pole switch for receiving the high voltage at the first pole and the intermediate voltage only through the second pole to output the word line voltage through the third pole.

9. The device of claim 8, in which the three pole switch is a depletion-type MOS transistor.

10. The device of claim 8, in which the high voltage generator generates the high voltage in response to an activation signal, and the first regulator outputs the intermediate voltage in response to the activation signal.

11. The device of claim 10, in which the three pole switch is a depletion-type MOS transistor.

12. The device of claim 10, in which the first regulator includes a current mirror controlled by the activation signal to receive the high voltage.

13. A word line voltage generating circuit for delivering a regulated output voltage VPPi, comprising:

a high voltage generator for generating a high voltage higher than a power supply voltage;

a first depletion-type MOS transistor having a first current electrode coupled to receive the high voltage, a control electrode coupled to receive a reference voltage, and a second current electrode to produce an intermediate voltage; and a second depletion-type MOS transistor having a first current electrode coupled to the high voltage, a control electrode coupled to receive the intermediate voltage, and a second current electrode coupled to deliver the regulated output voltage.

14. The circuit of claim 13, further comprising:

a switch coupled with the second current terminal of the first depletion-type MOS transistor and also coupled to receive an activation signal.

15. A voltage regulator circuit connected to a voltage booster for generating a high voltage VPP and having an output terminal for delivering a regulated output voltage VPPi, the voltage regulator comprising:

first means for receiving the high voltage VPP to produce a sufficiently constant voltage V1; and second means including a driver, which is coupled between the high voltage and the output terminal, in which the second means clamps the high voltage into the regulated output voltage which is such a voltage (V1+Vth) that the sufficiently constant voltage V1 is summed with a threshold voltage Vth of the driver, in which the driver comprises a depletion-type MOS transistor which has a first current electrode coupled to the high voltage, a second current electrode coupled to the output terminal and a control electrode coupled to receive the sufficiently constant voltage, and in which the depletion-type MOS transistor is shut off when the adjusted output voltage reaches the voltage (V1+Vth).

16. The voltage regulator circuit according to claim 15, in which the first means comprises:

a second depletion-type MOS transistor having a first current electrode coupled to receive the high voltage, a second current electrode coupled to the control elec trode of the first depletion-type MOS transistor, and a control electrode coupled to receive a reference voltage; and a switch coupled between the second current electrode of the second depletion-type MOS transistor and a ground voltage, the switch being switched according to a boost enable signal.

17. The voltage regulator circuit according to claim 16, in which the first means further comprises a load coupled between the second depletion-type MOS transistor and the switch.

18. A voltage regulator circuit connected to a voltage booster for generating a high voltage VPP and having an output terminal for delivering a regulated output voltage VPPi, the voltage regulator comprising:

first means for receiving the high voltage VPP to produce a sufficiently constant voltage V1; and second means including a driver, which is coupled between the high voltage and the output terminal, in which the second means clamps the high voltage into the regulated output voltage which is such a voltage (V1+Vth) that the sufficiently constant voltage V1 is summed with a threshold voltage Vth of the driver, in which the first means comprises:

a first PMOS transistor having a first current electrode coupled to receive the high voltage, a second current electrode coupled to a ground voltage via a first NMOS transistor which is switched according to a reference voltage, and a control electrode coupled to the second current electrode of the first PMOS transistor;

a second PMOS transistor having a first current electrode coupled to receive the high voltage, a second current electrode coupled to the control electrode of the depletion-type MOS transistor, and a control electrode coupled to the control electrode of the first PMOS transistor, and a second NMOS transistor having a first current electrode and a control electrode coupled to the control electrode of the depletion-type MOS transistor, and a second current electrode coupled to the ground voltage, wherein the sufficiently constant voltage V1 is output from the second current electrode of the second PMOS transistor.

19. A voltage regulator circuit connected to a voltage booster for generating a high voltage VPP and having an output terminal for delivering a regulated output voltage VPPi, the voltage regulator comprising:

first means for receiving the high voltage VPP to produce a sufficiently constant voltage V1; and second means including a driver, which is coupled between the high voltage and the output terminal, in which the second means clamps the high voltage into the regulated output voltage which is such a voltage (V1+Vth) that the sufficiently constant voltage V1 is summed with a threshold voltage Vth of the driver, in which the first means comprises:

a first PMOS transistor having a first current electrode coupled to receive the high voltage, a second current electrode coupled to a ground voltage via a first NMOS transistor which is switched according to a reference voltage, and a control electrode coupled to the second current electrode of the first PMOS transistor, a second PMOS transistor having a first current electrode coupled to receive the high voltage, a second current electrode coupled to the control electrode of the depletion-type MOS transistor, and a control electrode coupled to the control electrode of the first PMOS transistor, and a resistor coupled between the second current electrode of the second PMOS transistor and the ground voltage, wherein the sufficiently constant voltage V1 is output from the second current electrode of the second PMOS transistor.

20. A semiconductor memory device comprising:

an array of memory cells arranged in rows and columns;

a row decoder for selecting one of the rows; and a word line voltage generating circuit for generating a word line voltage to be supplied to the selected row, wherein the word line voltage generating circuit includes:

a voltage booster for generating a high voltage, means for receiving the high voltage to produce a sufficiently constant voltage, and a depletion-type MOS transistor coupled between the high voltage and the row decoder, in which the depletion-type MOS transistor is shut off when the word line voltage reaches such a required voltage value that a value of the sufficiently constant voltage is summed with an absolute value of a threshold voltage of the depletion-type MOS transistor.

21. A voltage regulator circuit connected to a voltage booster for generating a high voltage VPP over a power supply voltage and having an output terminal for delivering a regulated output voltage VPPi, the voltage regulator comprising:

a first regulator for adjusting the high voltage VPP to output a sufficiently constant voltage V1 lower than the adjusted output voltage VPPi; and a second regulator for adjusting the high voltage VPP according to the sufficiently constant voltage V1 to output the adjusted output voltage.

22. The voltage regulator circuit according to claim 21, in which the second regulator comprises a depletion-type NMOS transistor having:

a drain connected to receive the high voltage, a source connected to the output terminal, and a gate connected to receive the sufficiently constant voltage.

* * * * *